(12) United States Patent
Akarvardar et al.

(10) Patent No.: US 11,901,004 B2
(45) Date of Patent: Feb. 13, 2024

(54) MEMORY ARRAY, MEMORY STRUCTURE AND OPERATION METHOD OF MEMORY ARRAY

(71) Applicant: Taiwan Semiconductor Manufacturing Company, Ltd., Hsinchu (TW)

(72) Inventors: Kerem Akarvardar, Hsinchu (TW); Win-San Khwa, Taipei (TW); Rawan Naous, Hsinchu (TW); Jin Cai, Hsinchu (TW); Meng-Fan Chang, Taichung (TW); Hon-Sum Philip Wong, Stanford, CA (US)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 130 days.

(21) Appl. No.: 17/715,964

(22) Filed: Apr. 8, 2022

(65) Prior Publication Data

US 2023/0326525 A1   Oct. 12, 2023

(51) Int. Cl.
*G11C 13/00* (2006.01)
*G06F 17/16* (2006.01)

(52) U.S. Cl.
CPC .......... *G11C 13/0069* (2013.01); *G06F 17/16* (2013.01); *G11C 13/0004* (2013.01); *G11C 2213/15* (2013.01)

(58) Field of Classification Search
CPC ............ G11C 13/0069; G11C 13/0004; G11C 2213/15; G06F 17/16

USPC ........................................ 365/230.03, 230.06
See application file for complete search history.

(56) References Cited

U.S. PATENT DOCUMENTS

| | | | | |
|---|---|---|---|---|
| 5,172,196 A | * | 12/1992 | Matsukawa | H01L 29/7883 257/532 |
| 5,295,096 A | * | 3/1994 | Nakajima | H10B 69/00 365/185.11 |
| 5,885,871 A | * | 3/1999 | Chan | H01L 29/42324 257/E21.422 |
| 10,854,297 B1 | * | 12/2020 | Wu | G11C 16/10 |
| 2003/0235067 A1 | * | 12/2003 | Sakai | G11C 11/22 365/145 |

(Continued)

FOREIGN PATENT DOCUMENTS

| | | | | |
|---|---|---|---|---|
| EP | 991080 A2 | * | 4/2000 | G11C 16/0433 |
| WO | WO-9400881 A1 | * | 1/1994 | H01L 27/115 |

*Primary Examiner* — Michael T Tran
(74) *Attorney, Agent, or Firm* — JCIPRNET

(57) ABSTRACT

A memory array, a memory structure and an operation method of a memory array are provided. The memory array includes memory cells, floating gate transistors, bit lines and word lines. The memory cells each comprise a capacitor and an electrically programmable non-volatile memory (NVM) serially connected to the capacitor, and further comprise a write transistor with a first source/drain terminal coupled to a common node of the capacitor and the electrically programmable NVM. The floating gate transistors respectively have a gate terminal electrically floated and coupled to the capacitors of a column of the memory cells. The bit lines respectively coupled to the electrically programmable NVMs of a row of the memory cells. The word lines respectively coupled to gate terminals of the write transistors in a row of the memory cells.

20 Claims, 6 Drawing Sheets

(56) References Cited

U.S. PATENT DOCUMENTS

| | | | | |
|---|---|---|---|---|
| 2004/0195593 A1* | 10/2004 | Diorio | ............... | G11C 16/3404 257/202 |
| 2008/0211001 A1* | 9/2008 | Shiba | ................... | H10B 41/40 257/E21.691 |
| 2011/0316060 A1* | 12/2011 | Yao | ...................... | H10B 41/30 438/257 |
| 2012/0063203 A1* | 3/2012 | Matsuzaki | ............ | G11C 11/404 365/149 |
| 2013/0321248 A1* | 12/2013 | Kimura | ............... | H01L 33/0041 345/76 |
| 2014/0021526 A1* | 1/2014 | Yao | ...................... | G11C 16/06 257/E21.422 |
| 2014/0022844 A1* | 1/2014 | Yao | ...................... | H10B 41/35 257/E29.342 |
| 2014/0029340 A1* | 1/2014 | Wang | ................... | H01L 27/105 365/185.08 |
| 2015/0070992 A1* | 3/2015 | Yao | ................... | G11C 14/0018 365/185.08 |
| 2015/0187775 A1* | 7/2015 | Yamamoto | ............. | H10B 12/50 257/43 |
| 2016/0351572 A1* | 12/2016 | Atsumi | ............... | H01L 29/7869 |
| 2017/0033116 A1* | 2/2017 | Wang | ................. | H01L 29/7813 |
| 2017/0069386 A1* | 3/2017 | Song | ................. | G11C 16/3481 |
| 2017/0169899 A1* | 6/2017 | Lal | ........................ | G11C 19/00 |
| 2020/0160924 A1* | 5/2020 | Chien | ................... | H10B 41/35 |
| 2020/0176046 A1* | 6/2020 | Lu | ...................... | G11C 14/0018 |
| 2021/0280592 A1* | 9/2021 | Chen | ................. | G11C 16/0441 |
| 2021/0287746 A1* | 9/2021 | Chen | ................. | G11C 16/0433 |
| 2022/0264046 A1* | 8/2022 | Inoue | ............... | H01L 27/14621 |
| 2023/0013149 A1* | 1/2023 | Akiyama | ......... | H01L 27/14627 |

* cited by examiner

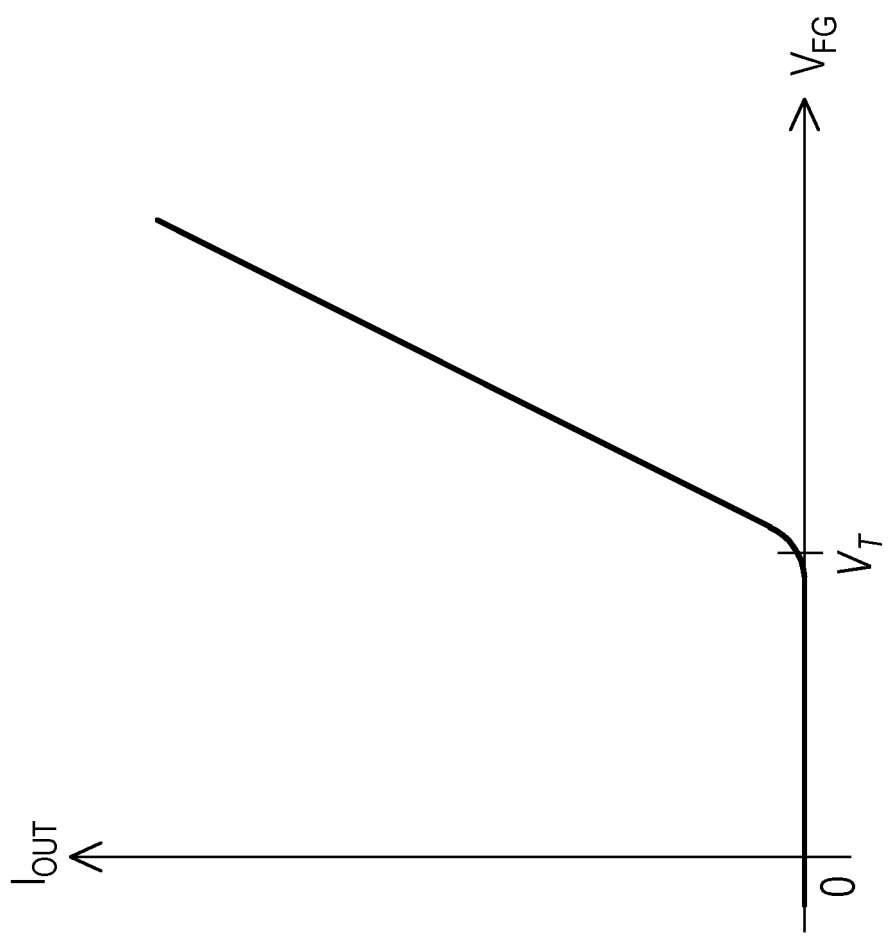

MEMORY ARRAY, MEMORY STRUCTURE AND OPERATION METHOD OF MEMORY ARRAY

BACKGROUND

Machine learning (ML) and artificial intelligence (AI) are increasingly applied in various scientific fields. Deep neural networks (DNNs) and convolutional neural networks (CNNs), as the most representative ML algorithms, are widely used in computer vision, pattern recognition, voice recognition, natural language processing and so forth. Recently, these algorithms have achieved revolutionary accuracy, but such level of accuracy also comes with substantial computation workloads.

Conventional computing architecture is struggling to meet such extensive computational load due to low-bandwidth and high latency data communication with off-chip memory. In order to overcome this challenge, non-Von Neumann computing architectures including in-memory computing and near-memory computing architectures have been introduced. For further improving these non-Von Neumann computing architectures, innovative neural integrated circuits used in these architectures are required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a diagram illustrating variation of an output current of a floating gate transistor with a gate terminal coupled to a column of the memory cells, with respect to a gate voltage sweeping through the threshold voltage of the floating gate transistor.

DETAILED DESCRIPTION

Figure 1:
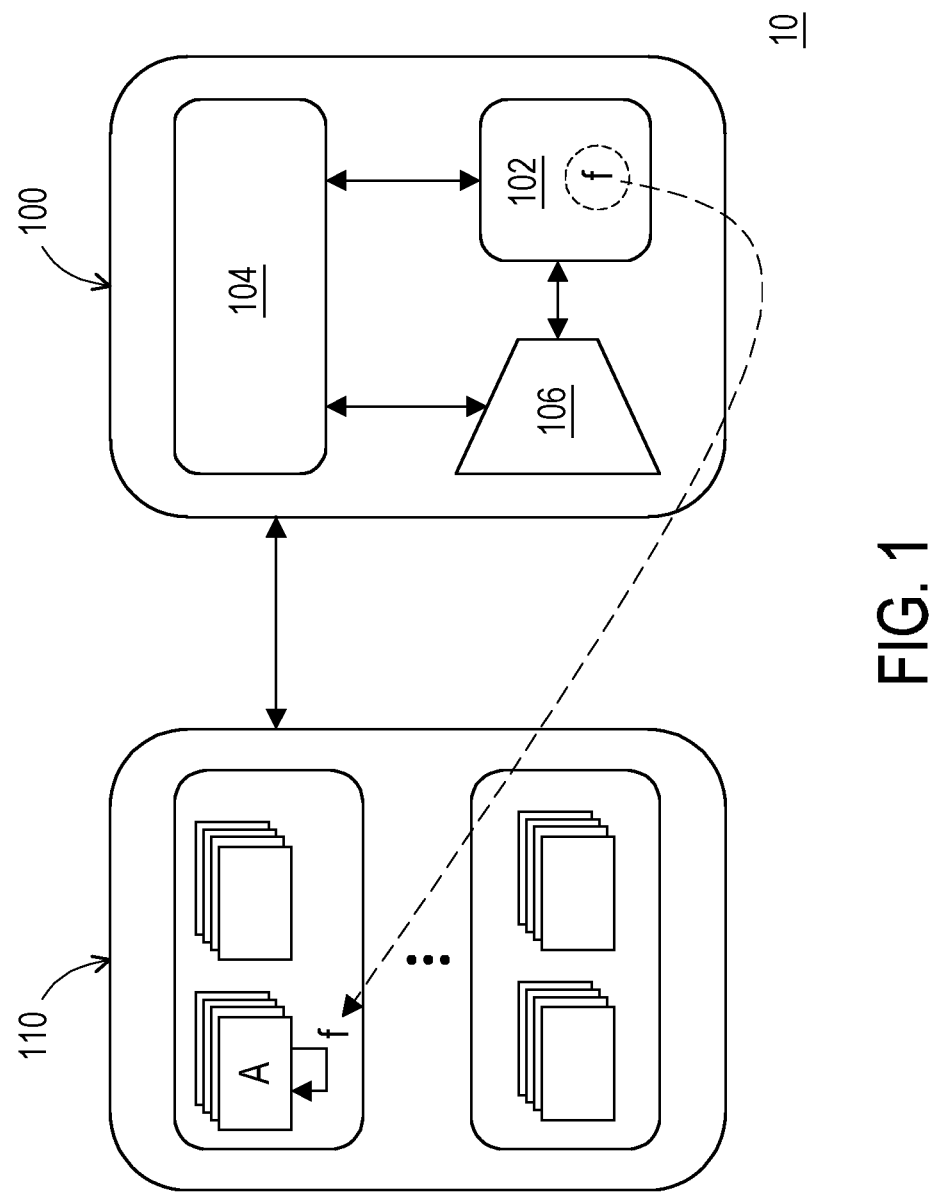
FIG. 1 is a block diagram illustrating a computation architecture according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram illustrating a computation architecture 10 according to some embodiments of the present disclosure.

Referring to FIG. 1, the computation architecture 10 is a non-Von Neumann architecture. As similar to a Von Neumann architecture, the computation architecture 10 may include a processor 100 and a memory module 110. The processor 100 may include an arithmetic logic unit 102, a control unit 104 and a cache 106. The arithmetic logic unit 102 allows arithmetic (add, subtract and so forth) and logic (AND, OR, NOT and so forth) operations to be carried out. The control unit 104 controls how the arithmetic logic unit 102, the memory module 110 and input/output devices (not shown) respond to program instructions the control unit 104 has received from the memory module 110. In addition, the control unit 104 may also provide timing and control signals required by other computer components. The cache 106 includes high speed storage devices. Data may be stored in the cache 106 before it can be processed.

As a difference from a Von Neumann architecture, computation is at least partly performed by exploiting physical attributes of the memory module 110 organized as a computational memory. In this way, when data "A" is stored in a memory cell of the memory module 30 and a function f(A) is instructed to be performed, the data "A" does not have to be brought to the arithmetic logic unit 102 in the processor 100. Rather, the memory module 110 can be operated to perform the function f(A). Therefore, data transfer between the memory module 30 and the arithmetic logic unit 102, which may result in a serious performance bottleneck, can be significantly reduced. As compared to a Von Neumann architecture, data processing in the computation architecture 10 may be more efficient in terms of energy and latency.

According to some embodiments, the memory module 110 is configured to perform matrix-vector multiplication (MVM) operations, as each presented by an equation (1). Signal propagation through a deep neural network (DNN) is dominated by the MVM operations. During a MVM operation, a weight matrix including weights $W_{11}$, $W_{12}$ ... $W_{nm}$ and an activation vector including inputs $x_1$, $x_2$ ... $x_m$ are multiplied, and an output vector including outputs $a_1$, $a_2$ ... $a_n$ is obtained. Each of the outputs is determined by a weighted sum operation as shown in an equation (2). The weights are programmed to memory cells of the memory module 110, and voltage pulses as the inputs are provided to the memory cells. Multiplication of the weights and the inputs may take place at the memory cells, and the results are added at floating terminals each connecting a column of the memory cells, then output as analog signals.

$$\begin{bmatrix} W_{11} & W_{12} & \cdots & W_{1m} \\ W_{21} & W_{22} & \cdots & W_{2m} \\ \vdots & \vdots & \cdots & \vdots \\ W_{n1} & W_{n2} & \cdots & W_{nm} \end{bmatrix} \cdot \begin{bmatrix} x_1 \\ x_2 \\ \vdots \\ x_m \end{bmatrix} = \begin{bmatrix} a_1 \\ a_2 \\ \vdots \\ a_n \end{bmatrix} \quad (1)$$

$$a_i = \sum_{j=1}^{m} W_{ij} x_j \quad (2)$$

Figure 2A:
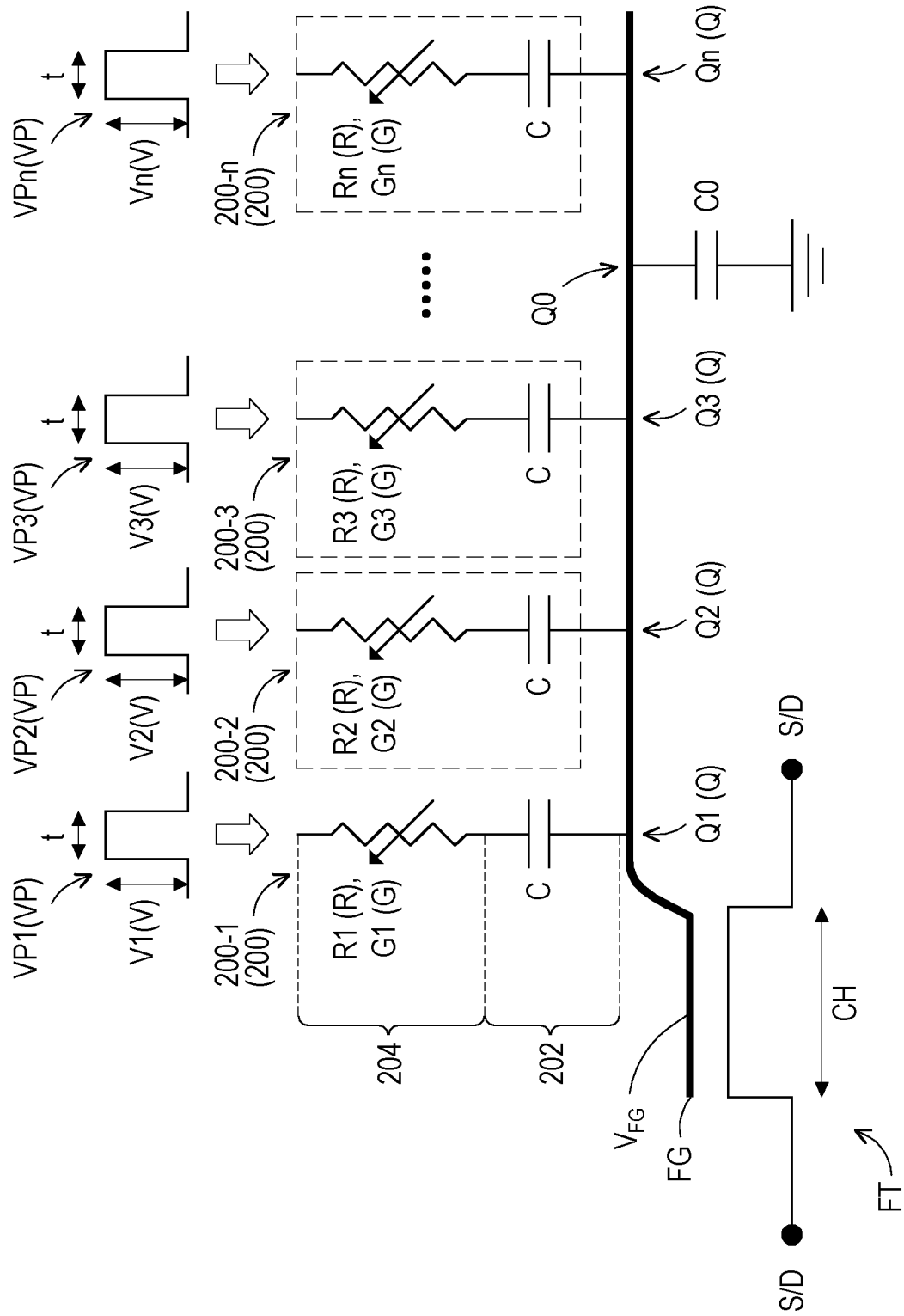
FIG. 2A is a circuit diagram schematically illustrating a column of memory cells in the memory module as shown in FIG. 1, according to some embodiments of the present disclosure.

FIG. 2A is a circuit diagram schematically illustrating a column of memory cells 200 in the memory module 110 as shown in FIG. 1, according to some embodiments of the present disclosure.

Referring to FIG. 2A, a column of memory cells 200 are coupled to a gate terminal FG of a floating gate transistor FT. Multiplication of the weights and the inputs take place at the memory cells 200, and a gate voltage of the floating gate transistor FT is determined by collective contribution of all weighted inputs. Variation of the gate voltage may affect an output current of the floating gate transistor FT, which may be provided as an analog signal.

The memory cells 200 respectively include a capacitor 202 and an electrically programmable resistive non-volatile memory (NVM) 204 serially connected to the capacitor 202. A first terminal of each capacitor 202 is coupled to the gate terminal FG of the floating gate transistor FT, and a second terminal of each capacitor 202 is coupled to one of the electrically programmable NVMs 204. The capacitors 202 of the memory cells 200 may be partially charged during a MVM operation, and may be discharged thereafter. According to some embodiments, the capacitors 202 of all of the memory cells 200 have substantially identical capacitance.

The electrically programmable NVMs 204 may also be two-terminal devices. A first terminal of each electrically programmable NVM 204 is coupled to one of the capacitors 202, and a second terminal of each electrically programmable NVM 204 is configured to receive an input voltage pulse VP during a MVM operation. As will be further described, the electrically programmable NVMs 204 are preliminarily programmed before receiving the input voltage pulses VP. Each electrically programmable NVM 204 is programmed with a certain resistance, which sets a conductance of the electrically programmable NVM 204. Various conductances of the electrically programmable NVMs 204 may determine the weights stored in the memory cells 200, while the input voltage pulses VP are provided to the electrically programmable NVMs 204 as the inputs.

According to some embodiments, the electrically programmable NVMs 204 are similar to resistance adjustable elements in a resistive random access memory (RRAM). In these embodiments, the electrically programmable NVMs 204 respectively include a pair of electrodes and a dielectric layer lying between the electrodes. A conductive path (or referred to as a conductive filament) can be established in the dielectric layer, and a size (e.g., length, width) of the conductive path may be altered by adjusting a programming voltage applied across the dielectric layer, thus the dielectric layer can be programmed with multiple resistance states. As an example, the dielectric layer may be formed of hafnium oxide, titanium oxide, tantalum oxide, nickel oxide, zinc oxide, zinc titanate, manganese oxide, magnesium oxide, aluminum oxide, zirconium oxide, or so forth.

According to other embodiments, the electrically programmable NVMs 204 are similar to resistance adjustable elements in a phase change random access memory (PCRAM). In these embodiments, the electrically programmable NVMs 204 respectively include a pair of electrodes and a phase change layer lying between the electrodes. A crystallinity of the phase change layer can be altered by adjusting a programming voltage applied across the phase change layer, and a resistance of the phase change layer is altered accordingly. As a result, the phase change layer may have various resistance states. As an example, the phase change layer may be formed of a chalcogenide compound.

However, the electrically programmable NVMs 204 are not limited to the resistance adjustable elements in RRAM and PCRAM. Any resistor with resistance adjustable by controlling voltage across the resistor can be used as the electrically programmable NVMs 204.

The floating gate transistor FT is a field effect transistor with the gate terminal FG configured to be electrically floated. A gate capacitor defined between the gate terminal FG and a channel region CH of the floating gate transistor FT can be charged by the memory cells 200. When the gate capacitor is sufficiently charged that a voltage across the gate capacitor (i.e., the gate voltage) reaches a threshold voltage, a conduction path may be established across the channel region CH. Meanwhile, an output current may flow across the channel region CH from one of source/drain terminals S/D at opposite sides of the channel region CH to another. The output current is related to the gate voltage, and the gate voltage is determined by a summation of the weighted inputs. Therefore, the output current of the floating gate transistor FT can be used as an analog signal indicating the summation of the weighted inputs.

Assume that the gate terminal FG of the floating gate transistor FT is initially grounded, then the charges induced at the gate terminal FG of the floating gate transistor FT by one of the memory cells 200 can be presented by an equation (3), where Q stands for the charges induced on the gate terminal FG by the memory cell 200; V stands for an amplitude of the voltage pulse VP provided to the memory cell 200; t stands for a width of the voltage pulse VP; R stands for a resistance of the electrically programmable NVM 204 in the memory cell 200; and C stands for a capacitance of the capacitor 202.

$$Q = CV(1 - e^{-t/RC}) \quad (3)$$

The memory cell 200 is operated in a dynamic region where the capacitor 202 is transiently charged from a zero charge state to an unsaturated state. According to some embodiments, the width t of the voltage pulse VP is much less than a product of the resistance R of the electrically programmable NVM 204 and the capacitance C of the capacitor 202 (i.e., t<<RC). In these embodiments, the term $e^{-t/RC}$ in the equation (3) approximates (1−t/RC), and the equation (3) can be rewritten into an equation (4).

$$Q = CV \cdot (t/RC) \quad (4)$$

By cancelling the common factor (i.e., the capacitance C) and substituting (1/R) with a conductance G of the electrically programmable NVM 204, the equation (4) can be reduced to an equation (5).

$$Q = G \cdot V \cdot t \quad (5)$$

As indicated by the equation (5), if the gate terminal FG is initially grounded and the width t of the voltage pulse VP provided to the memory cell 200 is fixed, the charges Q induced on the gate terminal FG by the memory cell 200 is determined by the conductance G of the electrically programmable NVM 204 in the memory cell 200 and the amplitude V of the voltage pulse VP. To be more specific, when the width t of the voltage pulse VP is constant, the charges Q induced by the memory cell 200 is proportional to the product of the conductance G of the electrically programmable NVM 204 and the amplitude V of the voltage pulse VP. The conductance G may determine the weight stored in the memory cell 200; the amplitude V of the voltage pulse VP may be functioned as the input provided to the memory cell 200; and the charges Q is indicative of a product of the weight and the input. Further, the charges Q indicating the product of the weight and the input is insensitive to the capacitance C of the capacitor 202 in the memory cell 200. As compared to setting the capacitances C of the capacitors 202 as weights (the capacitors 202 representing different weights may be different from each other in terms of footprint area), using the conductances G of the electrically programmable NVMs 204 to determine weights can allow a greater range of values for the weights, without being limited by footprint area of the memory cells 200. Therefore, the memory module 110 including the memory cells 200 can be further scaled, or cell density of the memory module 110 can be further increased. According to some embodiments, a ratio of the highest conductance G over the lowest conductance G is equal to or greater than 100.

As further indicated by the equation (5), the charges Q has a linear relationship with the amplitude V of the voltage pulse VP, since the conductance G of the electrically programmable NVM 204 and the width t of the voltage pulse VP are independent from the amplitude V of the voltage pulse VP. However, the equation (5) is true only when the width t of the voltage pulse VP is much less than a product of the resistance R of the electrically programmable NVM 204 and the capacitance C of the capacitor 202 (i.e., t<<RC). In order to enable the linear relationship between the charges Q and the amplitude V of the voltage pulse VP, the width t of the voltage pulse VP has to be sufficiently short. In addition, the product of the resistance R and the capacitance C can be maximized. As an alternative, the capacitance C can be raised to ensure a product of the capacitance C and a minimum value of the resistance R is still much greater than the width t of the voltage pulse VP. In order to avoid from significant increase of cell footprint resulted from increasing the capacitance C of the capacitor 202, the minimum value of the resistance R of the electrically programmable NVM 204 can be maximized as well. Those skilled in the art may adjust the width t of the voltage pulse VP, the capacitance C of the capacitor 202 and the resistance R of the electrically programmable NVM 204 for obtaining the linear relationship between the charges Q and the amplitude V of the voltage pulse VP, according to circuit design, process limit, material selection or so forth. The present disclosure is not limited to specific ranges of the width t of the voltage pulse VP, the capacitance C of the capacitor 202 and the resistance R of the electrically programmable NVM 204.

The gate terminal FG of each floating gate transistor FT may be coupled to n memory cells 200, including a memory cell 200-1, a memory cell 200-2, a memory cell 200-3, . . . to a memory cell 200-n. The capacitors 202 of the memory cells 200-1 to 200-n have identical capacitance C. On the other hand, the electrically programmable NVMs 102 of the memory cells 200-1 to 200-n are programmed to have various resistances R, thus having various conductances G. As shown in FIG. 2A, the electrically programmable NVM 204 of the memory cell 200-1 is programmed with a resistance R1 and having a conductance G1; the electrically programmable NVM 204 of the memory cell 200-2 is programmed with a resistance R2 and having a conductance G2; the electrically programmable NVM 204 of the memory cell 200-3 is programmed with a resistance R3 and having a conductance G3; . . . and the electrically programmable NVM 204 of the memory cell 200-n is programmed with a resistance Rn and having a conductance Gn.

Further, the voltage pulses VP provided to the memory cells 200-1 to 200-n may have identical width t, but may be different from one another in terms of the amplitude V. A voltage pulse VP1 provided to the memory cell 200-1 has an amplitude V1; a voltage pulse VP2 provided to the memory cell 200-2 has an amplitude V2; a voltage pulse VP3 provided to the memory cell 200-3 has an amplitude V3; . . . and a voltage pulse VPn provided to the memory cell 200-n has an amplitude Vn. Although the amplitudes V1 to Vn are depicted identically, some of the amplitudes V1 to Vn may be actually different from one another, while some of the amplitudes V1 to Vn may be identical.

Given that the memory cells 200-1 to 200-n are programmed with various weights (i.e., the conductances G1 to Gn) and provided with various inputs (i.e., the voltage pulses VP1 to VPn with amplitudes V1 to Vn), charges Q induced at the gate terminal FG of the floating gate transistor FT by the memory cells 200-1 to 200-n may vary. Charges Q1 are induced by the memory cell 200-1; charges Q2 are induced by the memory cell 200-2; charges Q3 are induced by the memory cell 200-3; . . . and charges Qn are induced by the memory cell 200-n.

The charges Q1 to Qn induced by the memory cells 200-1 to 200-n are summed on the gate terminal FG of the floating gate transistor FT. Charge balance on the gate terminal FG of the floating gate transistor FT can be presented by an equation (6), where $Q_{FG}$ stands for net charge on the gate terminal FG, and Q0 stands for charges induced by a parasitic capacitance C0 between the gate terminal FG of the floating gate transistor FT and a substrate (not shown) on which the floating gate transistor FT is formed.

$$Q_{FG} = Q0 - (Q1 + Q2 + Q3 + \ldots + Qn) \quad (6)$$

In the embodiments where the width t of each voltage pulse VP is much less than the product of the resistance R and the capacitance C of the corresponding memory cell 200 (i.e., t<<RC), the charges Q induced by the memory cell 200 approximate a product of the width t of each voltage pulse VP, the conductance G of the electrically programmable NVM 204 in the memory cell 200 and a voltage across the memory cell 200, as indicate by the equation (3). A voltage at the gate terminal FG controls switching of the floating gate transistor FT, thus the gate terminal FG is not grounded in actual condition. Accordingly, the voltage across the memory cell 200 can be expressed by a difference between the amplitude V of the voltage pulse VP provided to the memory cell 200 and a voltage $V_{FG}$ at the gate terminal FG of the floating gate transistor FT. Therefore, in these embodiments, the equation (6) can be rewritten as an equation (7).

$$Q_{FG} = Q_0 + t \cdot [G1(V_{FG} - V1) + G2(V_{FG} - V2) + G3(V_{FG} - V3) + \ldots + Gn(V_{FG} - Vn)] \quad (7)$$

The equation (7) can be further simplified as an equation (8).

$$(Q_{FG} - Q0)/t = V_{FG} \Sigma_{i=1}^{n} Gi - \Sigma_{i=1}^{n} Gi \cdot Vi \quad (8)$$

Assume that there is no residual charge on the gate terminal FG, then the net charge $Q_{FG}$ on the gate terminal FG should be zero. Further, the capacitor between the gate terminal FG and the substrate is assumed to be fully charged, thus the charges Q0 of the capacitor should be equal to a product of the capacitance C0 and the voltage $V_{FG}$ at the gate terminal FG. As applying these assumptions, the equation (8) can be further sorted as an equation (9).

$$V_{FG}=1/(\Sigma_{i=1}^{n}Gi+C0/t)\cdot\Sigma_{i=1}^{n}Gi\cdot Vi \quad (9)$$

According to typical embodiments, a summation of the conductances G1 to Gn (i.e., $\Sigma_{i=1}^{n}Gi$) is ensured to be much greater than a fraction of the capacitance C0 over the width t of the voltage pulse VP (i.e., C0/t). In these embodiments, the equation (9) can be reduced to an equation (10).

$$V_{FG}\cong(\Sigma_{i=1}^{n}Gi\cdot Vi)\Sigma_{i=1}^{n}Gi \quad (10)$$

As indicated by the equation (10), in some embodiments, the voltage $V_{FG}$ at the gate terminal FG of the floating gate transistor FT approximates sum of the inputs (i.e., Vi) weighted by normalized conductances (i.e., $Gi/\Sigma_{i=1}^{n}Gi$). In addition, the equation (10) further indicates that the voltage $V_{FG}$ at the gate terminal FG of the floating gate transistor FT is independent of the capacitance C of the capacitors 202 in the memory cells 200-1 to 200-$n$.

Switching of the floating gate transistor FT is controlled by the voltage $V_{FG}$. When the voltage $V_{FG}$ is below a threshold voltage of the floating transistor FT, there may not be current passing through the channel region CH. On the other hand, when the voltage $V_{FG}$ reaches the threshold voltage, an output current flowing across the channel region CH may be generated, and an amplitude of this output current is dependent on a difference between the voltage $V_{FG}$ and the threshold voltage. The output current can be expressed by an equation (11), where $I_{OUT}$ stands for the output current; $V_T$ stands for the threshold voltage; $V_{DS}$ stands for a voltage difference between the two source/drain terminals S/D; and K is a coefficient. Further, FIG. 2B depicts the output current $I_{OUT}$ varying with respect to the voltage $V_{FG}$ sweeping through the threshold voltage $V_T$.

$$I_{OUT}=K(V_{FG}-V_T)V_{DS} \quad (11)$$

As shown in FIG. 2B, the output current $I_{OUT}$ is near zero when the voltage $V_{FG}$ is lower than the threshold voltage $V_T$. On the other hand, the output current $I_{OUT}$ begins rising when the voltage $V_{FG}$ reaches the threshold voltage $V_T$, and increases as the voltage $V_{FG}$ is further raised beyond the threshold voltage $V_T$. As also indicated by the equation (11), the greater difference between the voltage $V_{FG}$ and the threshold voltage $V_T$, the higher output current $I_{OUT}$ can be obtained. Since the voltage $V_{FG}$ is proportional to the sum of the inputs weighted by normalized conductance (as indicated by the equation (10)), the output current $I_{OUT}$ proportional to the difference between the voltage $V_{FG}$ and the threshold voltage $V_T$ can be used for indicating the sum of the weighted inputs. Moreover, as shown in FIG. 2B, the output current $I_{OUT}$ shows a non-linear characteristic with respect to variation of the voltage $V_{FG}$, which is similar to a rectified linear unit (ReLU) activation function preferably used in many types of neural networks. Therefore, the memory architecture according to various embodiments of the present disclosure is well applicable in neural network computing.

Figure 3A:
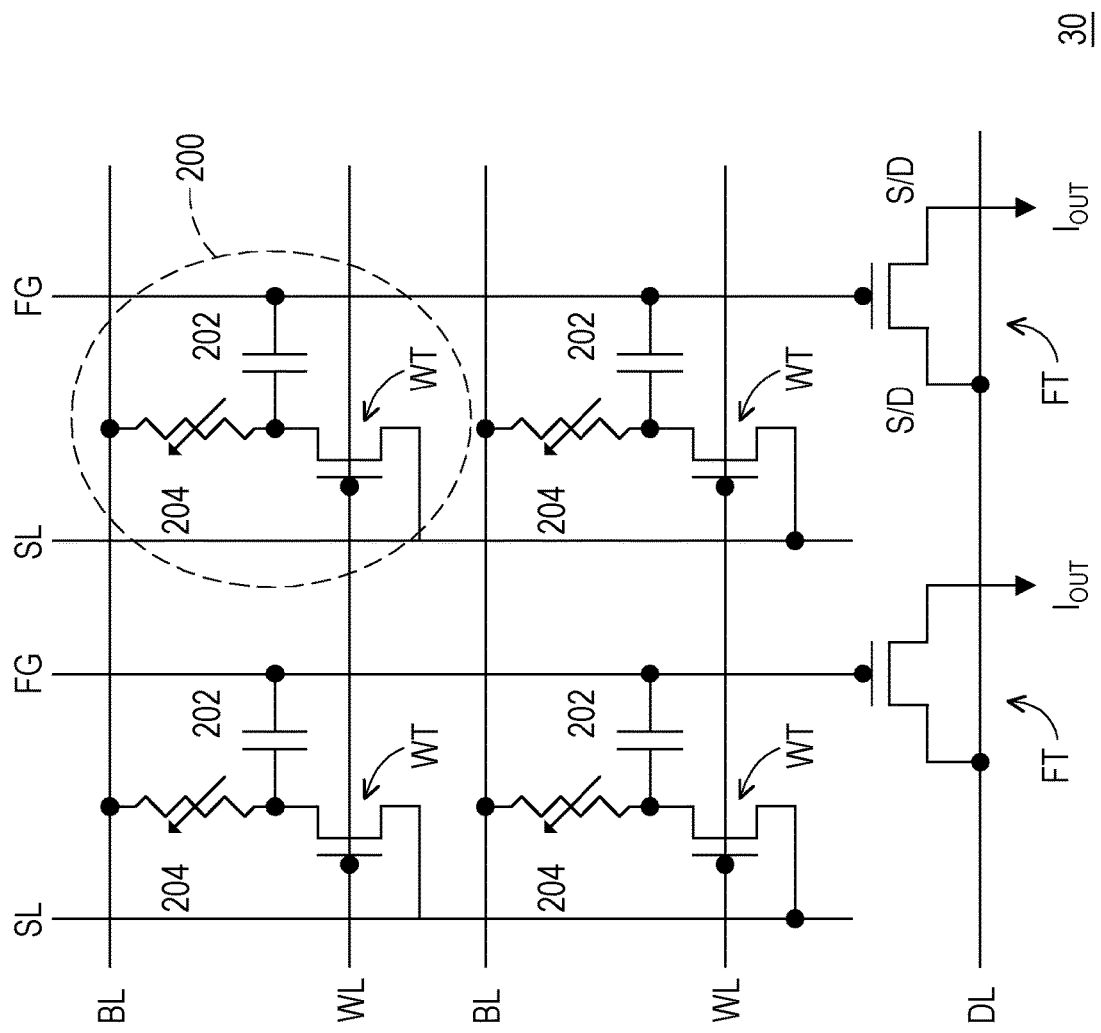
FIG. 3A is a circuit diagram illustrating a memory array including columns and rows of the memory cells, according to some embodiments of the present disclosure.

FIG. 3A is a circuit diagram illustrating a memory array 30 including columns and rows of the memory cells 200, according to some embodiments of the present disclosure.

Referring to FIG. 3A, the memory cells 200 in each column are coupled to the gate terminal FG of a floating gate transistor FT, as also described with reference to FIG. 2A. One of the source/drain terminals S/D of each floating gate transistor FT is coupled to an output terminal where the output current $I_{OUT}$ can be sensed or output, while the other source/drain terminal S/D may be coupled to a signal line DL. The signal line DL may be shared by multiple floating gate transistors FT, and configured to provide a source/drain voltage to the source/drain terminals S/D of each floating gate transistor FT.

The electrically programmable NVMs 204 of the memory cells 200 in each row may be coupled to a bit line BL, such that each electrically programmable NVM 204 is in connection between one of the capacitors 202 and one of the bit lines BL. The voltage pulses VP described with reference to FIG. 2A may be provided to the electrically programmable NVMs 204 of the memory cells 200 via the bit lines BL. As will be further described, the bit lines BL may also be biased with respect to the signal lines SL during programming of the electrically programmable NVMs 204.

Further, each of the memory cells 200 may further include a write transistor WT. The write transistors WT are coupled to the electrically programmable NVMs 204, and are configured to control access of the electrically programmable NVMs 204 during programming of the electrically programmable NVMs 204. According to some embodiments, the write transistor WT are field effect transistors, each having a gate terminal coupled to a word line WL, a source/drain terminal coupled to a common node of a capacitor 202 and an electrically programmable NVM 204 in a memory cell 200, and another source/drain terminal coupled to a signal line SL. When the electrically programmable NVM 204 in one of the memory cells 200 is selected for programming, the coupled word line WL is asserted, and the write transistor WT coupled to the selected electrically programmable NVM 204 is turned on. Accordingly, the selected electrically programmable NVM 204 can be programmed by controlling biasing of the coupled bit line BL and signal line SL. On the other hand, when a word line WL is not asserted, the coupled write transistor WT is in an off state, and the associated electrically programmable NVM 204 becomes inaccessible. In some embodiments, the write transistors WT of the memory cells 200 in the same row share the same word line WL, and the write transistor WT of the memory cells 200 in the same column share the same signal line SL.

It should be noted that, although the memory array 30 is depicted as having four memory cells 200 arranged along two columns and two rows, the memory array 30 may actually have much more memory cells 200 arranged along more than two columns and more than two rows. Those skilled in the art may adjust a number of the memory cells 200 in the memory array 30 according to available area and layout design, the present disclosure is not limited thereto.

Figure 3B:
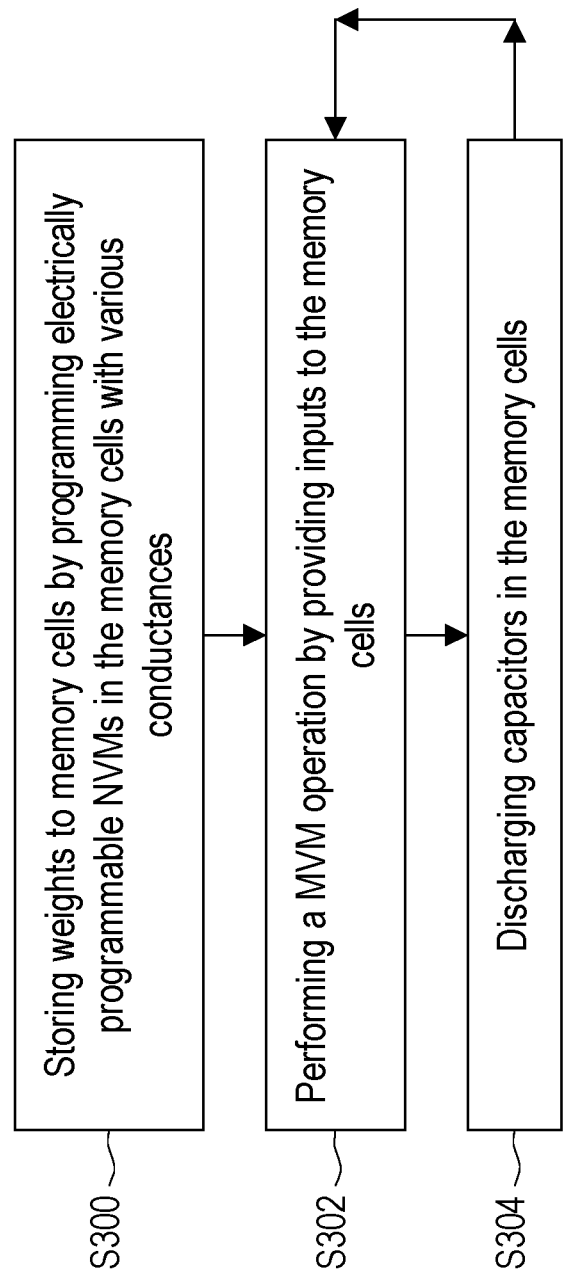
FIG. 3B is a flow diagram illustrating an operation cycle of the memory array, according to some embodiments of the present disclosure.

FIG. 3B is a flow diagram illustrating an operation cycle of the memory array 30, according to some embodiments of the present disclosure.

Referring to FIG. 3B, a step S300 is performed, and weights are stored in the memory cells 200 by programming the electrically programmable NVMs 204 in the memory cells 200 with various conductances. In some embodiments, a method for programming the electrically programmable NVMs 204 includes controlling the word lines WL, the bit lines BL and the signal lines SL. When the electrically programmable NVM 204 of a memory cell 200 is selected for programming, the write transistor WT of the memory cell 200 is turned on by asserting the coupled word line WL. Once the write transistor WT is turned on, a terminal of the selected electrically programmable NVM 204 is controlled by the signal line SL coupled to the write transistor WT, while the other terminal of the selected electrically programmable NVM 204 is controlled by the coupled bit line BL. By biasing the bit line BL and the signal line SL, the electrically programmable NVM 204 can be programmed with a certain conductance. As described above, an electrically programmable NVM 204 can be programmed if the coupled word line WL is asserted and the coupled bit line BL and signal line SL are properly biased. In other words, the electrically programmable NVMs 204 coupled to un-asserted word lines WL may not be programmed. In addition, the electrically programmable NVMs 204 coupled to the asserted word line WL but not sufficiently biased by the coupled bit line BL and signal line SL may not be programmed as well. In some embodiments, the electrically programmable NVMs 204 of the memory cells 200 in each row are simultaneously programmed with various conductances by asserting the coupled word line WL and allocating voltages provided to pairs of the coupled bit line BL and signal line SL. In alternative embodiments, the electrically programmable NVMs 204 are programmed independently.

After each programming operation, the write transistor(s) WT coupled to the selected electrically programmable NVM(s) 204 is/are turned off. In some embodiments, the capacitor(s) 202 coupled to the selected electrically programmable NVM(s) 204 is/are partially charged during programming of the selected electrically programmable NVM(s) 204. In these embodiments, charges may undesirably accumulate on the coupled gate terminal(s) FG before a MVM operation, and may result in errors in the MVM operation. In order to avoid such undesired charge accumulation, the write transistor(s) WT coupled to the selected electrically programmable NVM(s) 204 is/are remained in an on state for a while after the programming operation performed on the selected electrically programmable NVM(s) 204. In this way, previously charged capacitor(s) 202 can be discharged through conduction channel(s) of the write transistor(s).

Subsequently, a step S302 is performed, and a MVM operation is performed by providing inputs to the memory cells 200 stored with various weights. The weights are stored in the memory cells 200 as the normalized conductances of the electrically programmable NVMs 204, and the inputs are provided to the memory cells 200 as the amplitude of the voltage pulses VP described with reference to FIG. 2A. The voltage pulses VP are provided to the memory cells 200 via the bit lines BL. Meanwhile, the write transistors WT are kept in an off state by deactivating the word lines WL. Accordingly, each memory cell 200 may be considered as a resistor-capacitor (RC) circuit, as shown in FIG. 2A.

The inputs (i.e., the amplitude of the voltage pulse VP) provided to the memory cells 200 in each column are weighted by normalized conductances of the electrically programmable NVMs 204 in these memory cells 200. In addition, these weighted inputs are summed at the gate terminal FG of the coupled floating gate transistor FT, and the sum of the weighted inputs determines a voltage on the gate terminal FG (i.e., the voltage $V_{FG}$). Further, the output current $I_{OUT}$ of the floating gate transistor FT is affected by the voltage on the gate terminal FG, thus is indicative of the result of the multiply-accumulate operation (i.e., summation of the weighted inputs). Since the bit lines BL for providing the inputs are shared by multiple columns of the memory cells 200, a plurality of the multiply-accumulate operations can be executed in multiple columns of the memory cells 200 at the same time, and a plurality of the output currents $I_{OUT}$ can be provided simultaneously. In some embodiments, the signal line DL is asserted in the current step for controlling voltage difference between the source/drain terminals S/D of each floating gate transistor FT.

A step S304 is performed after the MVM operation, and the capacitors 202 in all memory cells 200 are discharged. By discharging the capacitors 202, the charges accumulated on the gate terminals FG of the floating gate transistors FT may be cleared. Therefore, the memory cells 200 can be ready for receiving another set of the inputs, to perform a next MVM operation. A method for discharging the capacitors 202 includes asserting all of the word lines WL, and coupling the signal lines SL to a ground voltage. As a consequence, a terminal of each capacitor 202 is grounded via a discharging path passing through a channel region of the coupled write transistor WT. In some embodiments, the gate terminals FG of the floating gate transistors FT are coupled to a ground voltage through additional transistors (not shown). In these embodiments, these additional transistors are turned on as well, and the terminals of the capacitors 202 coupled to the gate terminals FG of the floating gate transistors FT can be grounded via discharging paths passing through channel regions of these additional transistors.

One or more cycles each including the step S302 of performing a MVM operation and the following step S304 of discharging the capacitors 202 can be performed after the step S300 of storing weights into the memory cells 200. Optionally, a new set of weights may be programmed to the memory cells 200 to take place of the existing weights after a few cycles, and new cycles may be performed based on the new set of weights.

Figure 4:
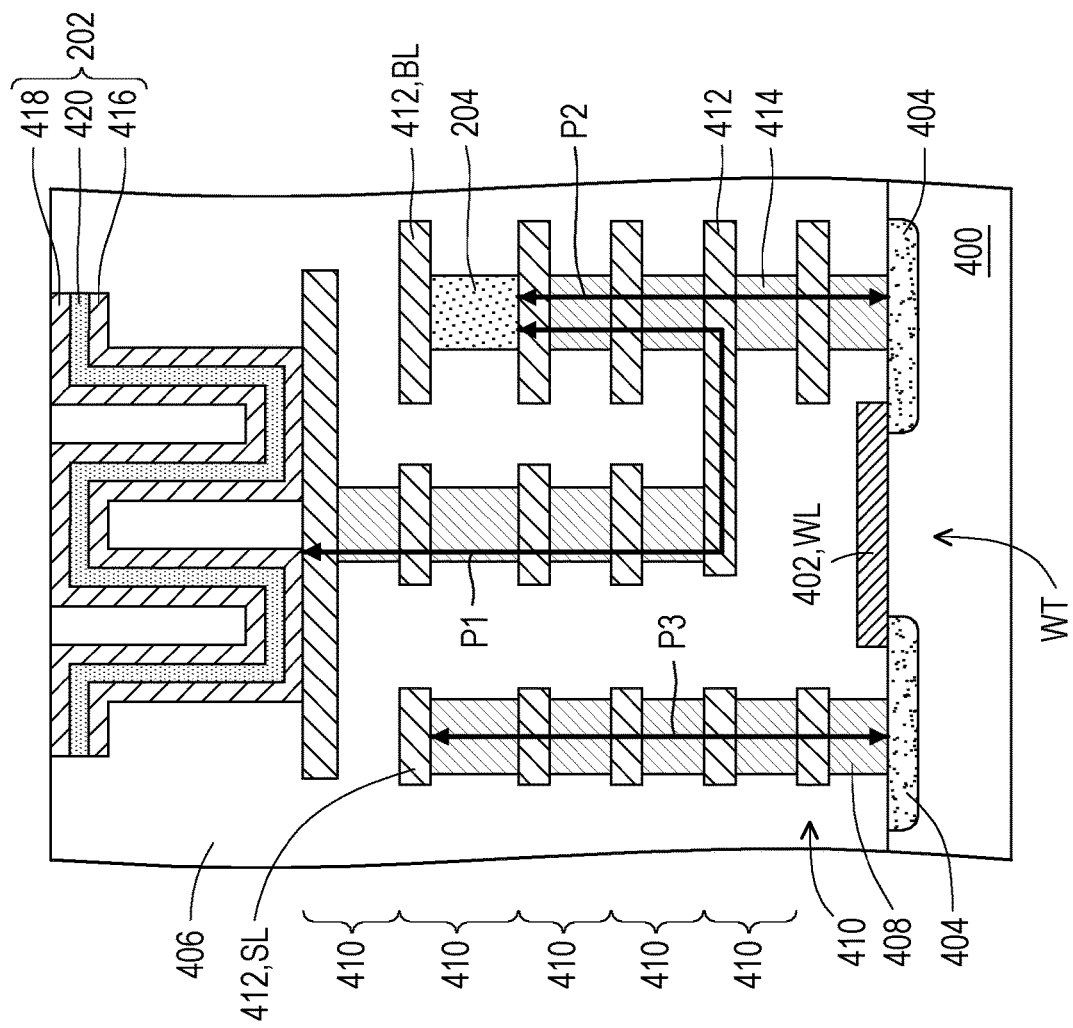
FIG. 4 is a schematic cross-sectional view illustrating one of the memory cells, according to some embodiments of the present disclosure.

FIG. 4 is a schematic cross-sectional view illustrating one of the memory cells 200, according to some embodiments of the present disclosure.

Referring to FIG. 4, the memory cell 200 is built on a substrate 400. The substrate 400 is a semiconductor substrate or a semiconductor-on-insulator (SOI) substrate. In addition, well regions and an isolation structure (both not shown) may be formed in the substrate 400.

The write transistor WT of the memory cell 200 includes a gate structure 402 disposed on a surface of the substrate 400. The gate structure 402 is functioned as a gate terminal of the write transistor WT. Although not shown, the gate structure 402 may further extend to be shared with other write transistors WT of the memory cell 200 in the same row, as one of the word lines WL shown in FIG. 3A. In some embodiments, as shown in FIG. 4, the write transistor WT is a planar-type field effect transistor, and the gate structure 402 is disposed on a planar portion of the substrate 404. In alternative embodiments, the write transistor WT is a fin-type field effect transistor (finFET), and the gate structure 402 covers and intersects with fin portion(s) of the substrate 400. In other embodiments, the write transistor WT is a gate-all-around field effect transistor (GAA FET), and the gate structure 402 wraps around a stack of channel structures formed on the substrate 400 and vertically separated from one another. Further, the write transistor WT also includes a pair of source/drain structures 404 at opposite sides of the gate structure 402, which are functioned as source/drain terminals of the write transistor WT. In some embodiments, the source/drain structures 404 are doped regions formed in the substrate 400. In alternative embodiments, the source/drain structures 404 are epitaxial structures external to the substrate 400.

A dielectric structure 406 including a stack of dielectric layers is formed on the substrate 400. The write transistor WT is covered by the dielectric structure 406. The capacitor 202 and the electrically programmable NVM 204 of the memory cell 200 as well as contact plugs 408 and metallization layers 410 for routing the write transistor WT, the capacitor 202 and the electrically programmable NVM 204 are embedded in the dielectric structure 406. The contact plugs 408 may stand on and establish electrical contact with the source/drain structures 404 of the write transistor WT. The metallization layers 410 are stacked on the contact plugs 408. In addition, each metallization layer 410 includes conductive patterns 412, and may further include conductive vias 414. The conductive patterns 412 extends laterally, while the conductive pattern 412 extend vertically and may connect the conductive patterns 412 in adjacent metallization layers 410. In some embodiments, 6 metallization layers are formed in the dielectric structure 406. However, those skilled in the art may adjust an amount of the metallization layers 410 according to layout design, the present disclosure is not limited thereto.

According to some embodiments, the capacitor 202 is formed on a conductive pattern 412 of an upper metallization layer 410, while the electrically programmable NVM 204 is defined between conductive patterns 412 of adjacent ones of lower metallization layers 410. For instance, the capacitor 202 may be formed on a conductive pattern of the sixth metallization layer 410, and the electrically programmable NVM 204 may be defined between conductive patterns 412 of the fourth and fifth metallization layers 410. The capacitor 202, the electrically programmable NVM 204 and the write transistor WT are interconnected through portions of the metallization layers 410 and the contact plugs 408, such that a first terminal of the capacitor 202, a first terminal of the electrically programmable NVM 204 and a first source/drain terminal of the write transistor WT (i.e., one of the source/drain structures 404) are jointed together. For instance, the first terminal of the capacitor 202 may be connected to the first terminal of the electrically programmable NVM 204 through a path P1 provided by the second to sixth metallization layers 410, and the first terminal of the electrically programmable NVM 204 may be connected to the first source/drain terminal of the write transistor WT through a path P2 provided by the first to fourth metallization layers 410 as well as some of the contact plugs 408. Further, the conductive pattern 412 coupled to a second terminal of the electrically programmable NVM 204 may be functioned as one of the bit lines BL, and one of the conductive patterns 412 coupled to a second source/drain terminal of the write transistor WT (i.e., the other source/drain structure 404) may be functioned as one of the signal lines SL. For instance, one of the conductive patterns 412 in the fifth metallization layer 410 and coupled to the second terminal of the electrically programmable NVM 204 is functioned as the bit line BL. In addition, another one of the conductive patterns 412 in the fifth metallization layer 410 and coupled to the second source/drain terminal of the write transistor WT is functioned as the signal line SL, and is connected to the second source/drain terminal of the write transistor WT along a path P3 provided by the first through fourth metallization layers 410 as well as some of the contact plugs 408.

The capacitor 202 may include a bottom electrode 416, a top electrode 418 and a dielectric layer 420 lying between the bottom electrode 416 and the top electrode 418. The bottom electrode 416 may be functioned as the first terminal of the capacitor 202 jointed with the first terminal of the electrically programmable NVM 204 and the first source/drain terminal of the write transistor WT. In some embodiments, the bottom electrode 416 covers a top surface of one of the dielectric layers in the dielectric structure 406, and extends along sidewalls of openings in this dielectric layer, to reach and further extend along the underlying conductive pattern 412 of the upper metallization layer 410. In these embodiments, this dielectric layer with openings and the underlying conductive pattern 412 are conformally covered by the bottom electrode 416. Further, the dielectric layer 420 and the top electrode 418 may conformally extend along the bottom electrode 416. The top electrode 418 may be functioned as a second terminal of the capacitor 202, and may be routed to a gate terminal of a floating gate transistor (not shown), as described with reference to FIG. 2A and FIG. 3A. According to some embodiments, the floating gate transistor is formed on the substrate 400 and covered by the dielectric structure 406, as similar to the write transistor WT. The top electrode 418 of the capacitor 202 may be routed to the gate terminal of the floating gate transistor through the metallization layers lying between (also not shown).

The electrically programmable NVM 204 at least includes a resistance adjustable layer. Such resistance adjustable layer is sandwiched between two electrodes as the first and second terminals of the electrically programmable NVM 204. According to some embodiments, the pair of electrodes may be disposed between conductive patterns 412 of two adjacent metallization layers 410. Optionally, the top electrode may be connected to a conductive pattern 412 of the overlying metallization layer 410 (functioned as the bit line) through an additional conductive via (not shown). Similarly, an optional conductive via may be disposed between the bottom electrode and a conductive pattern 412 of the underlying metallization layer 410. In those embodiments where the electrically programmable NVM 204 is formed as similar to a resistance adjustable element in a RRAM, the resistance adjustable layer is a dielectric layer, as described with reference to FIG. 2A. In addition, in those embodiments where the electrically programmable NVM 204 is formed as similar to a resistance adjustable element in a PCRAM, the resistance adjustable layer is a phase change layer.

Although not shown, a plurality of the memory cells 200 may be arranged side by side as an array, and the floating gate transistors FT as well as other driving circuits may be formed around a plurality of the memory cells 200. In addition, more dielectric layers and metallization layers may be formed over the capacitor 202, and a complete integrated memory circuit may be obtained. Further, electrical connectors may be formed on the integrated circuit, as inputs/outputs (I/Os) of the integrated circuit.

As described with reference to FIG. 2A, the capacitors 202 in the memory cells 200 may have identical capacitance, and various weights can be stored in the memory cells 200 as normalized conductances of the electrically programmable NVMs 204. In other words, the capacitors 202 in the memory cells 200 programmed with various weights have identical footprint area. Further, the electrically programmable NVMs 204 written with different conductances are different from one another in terms of properties of their resistance adjustable layers, but are identical to each other in terms of footprint area. Therefore, the memory cells 200 may have the same footprint area, even being programmed with different weights.

As above, various embodiments of the present disclosure provide a memory architecture capable of implementing computing in memory (CIM). A string of memory cells in the memory architecture are coupled to a gate terminal of a floating gate transistor. Each of the memory cells includes a capacitor with a fixed capacitance and an electrically programmable NVM programmed with a conductance indicating a weight stored in the memory cell. Voltage pulses (amplitudes of the voltage pulses) as inputs are provided to the memory cells, and the inputs are weighted by normalized conductances in the memory cells. The weighted inputs are summed at the gate terminal of the floating gate transistor, and the sum of the weighted inputs determines a voltage on the gate terminal, which further affect an output current of the floating gate transistor. Thus, the output current as an analog signal can indicate the sum of the weighted inputs. As compared to setting the capacitances of the capacitors as weights (the capacitors representing different weights may be different from each other in terms of footprint area), using the conductances of the electrically programmable NVMs to determine weights can allow greater variation of the weights, without being limited by available footprint area of the memory cells. Further, since electrical current can barely pass through the capacitors, sneak current among the memory cells can be effectively reduced, and the memory architecture can have improved energy efficiency.

In an aspect of the present disclosure, a memory array is provided. The memory array comprises: memory cells, each comprising a capacitor and an electrically programmable non-volatile memory (NVM) serially connected to the capacitor, and further comprising a write transistor with a first source/drain terminal coupled to a common node of the capacitor and the electrically programmable NVM; floating gate transistors, each having a gate terminal electrically floated and coupled to the capacitors of a column of the memory cells; bit lines, each coupled to the electrically programmable NVMs of a row of the memory cells; and word lines, each coupled to gate terminals of the write transistors in a row of the memory cells.

In another aspect of the present disclosure, a memory structure is provided. The memory structure comprises memory cells, formed on a substrate. The memory cells respectively comprise: a write transistor, disposed on a surface of the substrate; an electrically programmable non-volatile memory (NVM), disposed over the write transistor, wherein a first terminal of the electrically programmable NVM is electrically connected to a first source/drain structure of the write transistor, and a second terminal of the electrically programmable NVM is electrically connected to a bit line lying over the electrically programmable NVM; and a capacitor, disposed over the write transistor, with a bottom electrode electrically connected to the first terminal of the electrically programmable NVM and the first source/drain structure of the write transistor.

In yet another aspect of the present disclosure, an operation method of a memory array is provided. The memory array comprises memory cells and floating gate transistors, the memory cells respectively comprise a capacitor, an electrically programmable non-volatile memory (NVM) serially connected to the capacitor and a write transistor coupled to a common node of the capacitor and the electrically programmable NVM, the floating gate transistor respectively have a gate terminal electrically floated and coupled to the capacitors of a column of the memory cells. The operation method comprises: turning on the write transistors to program the electrically programmable NVMs with conductances indicating various weights stored in the memory cells; switching off the write transistors; and performing a matrix-vector multiplication (MVM) cycle. The MVM cycle comprises: providing voltage pulses as inputs to the electrically programmable NVMs, wherein the inputs and the weights are multiplied at the memory cells and summed at the gate terminals of the floating gate transistors, and output currents as results of the MVM operation are output by the floating gate transistors; and discharging the capacitors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array, comprising:
    memory cells, each comprising a capacitor and an electrically programmable non-volatile memory (NVM) serially connected to the capacitor, and further comprising a write transistor with a first source/drain terminal coupled to a common node of the capacitor and the electrically programmable NVM;
    floating gate transistors, each having a gate terminal electrically floated and coupled to the capacitors of a column of the memory cells;
    bit lines, each coupled to the electrically programmable NVMs of a row of the memory cells; and
    word lines, each coupled to gate terminals of the write transistors in a row of the memory cells.

2. The memory array according to claim 1, wherein the memory array is a computational memory array, and configured to perform a matrix-vector multiplication (MVM) operation.

3. The memory array according to claim 2, wherein the electrically programmable NVMs are configured to be programmed with various conductances.

4. The memory array according to claim 2, wherein the capacitors of the memory cells have substantially identical capacitance.

5. The memory array according to claim 2, wherein the bit lines are configured to receive voltage pulses with various amplitudes during the MVM operation.

6. The memory array according to claim 5, wherein the voltage pulses have substantially identical pulse width.

7. The memory array according to claim 2, wherein output currents as results of the MVM operation are provided from first source/drain terminals of the floating gate transistors.

8. The memory array according to claim 7, wherein each of the output currents shows a non-linear characteristic with respect to variation of a voltage at the gate terminal of the corresponding floating gate transistor.

9. The memory array according to claim 1, further comprising:
    first signal lines, each coupled to second source/drain terminals of the write transistors in a column of the memory cells.

10. The memory array according to claim 1, further comprising:
    a second signal line, coupled to second source/drain terminals of the floating gate transistors.

11. A memory structure, comprising:
    memory cells, formed on a substrate, and respectively comprising:
        a write transistor, disposed on a surface of the substrate;
        an electrically programmable non-volatile memory (NVM), disposed over the write transistor, wherein a first terminal of the electrically programmable NVM is electrically connected to a first source/drain structure of the write transistor, and a second terminal of the electrically programmable NVM is electrically connected to a bit line lying over the electrically programmable NVM; and a capacitor, disposed over the write transistor, with a bottom electrode electrically connected to the first terminal of the electrically programmable NVM and the first source/drain structure of the write transistor.

12. The memory structure according to claim 11, wherein a second source/drain structure of the write transistor in each memory cell is electrically connected to a signal line lying over the write transistor.

13. The memory structure according to claim 11, wherein a top electrode of the capacitor in each memory cell is electrically connected to a floating gate of a floating gate transistor.

14. The memory structure according to claim 11, wherein the electrically programmable NVM and the capacitor in each memory cell is embedded in a dielectric structure covering the write transistor.

15. The memory structure according to claim 11, wherein a resistance adjustable layer of the electrically programmable NVM in each memory cell is a dielectric layer or a phase change layer.

16. An operation method of a memory array, wherein the memory array comprises memory cells and floating gate transistors, the memory cells respectively comprise a capacitor, an electrically programmable non-volatile memory (NVM) serially connected to the capacitor and a write transistor coupled to a common node of the capacitor and the electrically programmable NVM, the floating gate transistor respectively have a gate terminal electrically floated and coupled to the capacitors of a column of the memory cells, and the operation method comprises:

turning on the write transistors to program the electrically programmable NVMs with conductances indicating various weights stored in the memory cells;

switching off the write transistors; and performing a matrix-vector multiplication (MVM) cycle, comprising:

providing voltage pulses as inputs to the electrically programmable NVMs, wherein the inputs and the weights are multiplied at the memory cells and summed at the gate terminals of the floating gate transistors, and output currents as results of the MVM operation are output by the floating gate transistors; and discharging the capacitors.

17. The operation method of the memory array according to claim 16, wherein the capacitors have substantially identical capacitance.

18. The operation method of the memory array according to claim 16, wherein the voltage pulses have substantially identical pulse width, and have various amplitudes.

19. The operation method of the memory array according to claim 16, wherein the write transistors are switched off after the capacitors are fully discharged after programming the electrically programmable NVMs and before performing the MVM cycle.

20. The operation method of the memory array according to claim 16, wherein the write transistors are turned off during providing the voltage pulses to the electrically programmable NVMs, and are switched on while discharging the capacitors in the MVM cycle.

* * * * *